(12) United States Patent
Morikawa et al.

(10) Patent No.: US 6,531,882 B2
(45) Date of Patent: Mar. 11, 2003

(54) METHOD AND APPARATUS FOR MEASURING CAPACITANCE

(75) Inventors: Masahiro Morikawa, Hino (JP); Kazumi Furuta, Hino (JP); Koji Horii, Hino (JP)

(73) Assignee: Konica Corporation (JP)

( * ) Notice: Subject to any disclaimer, the term of this patent is extended or adjusted under 35 U.S.C. 154(b) by 0 days.

(21) Appl. No.: 09/862,925

(22) Filed: May 22, 2001

(65) Prior Publication Data

US 2001/0045834 A1 Nov. 29, 2001

(30) Foreign Application Priority Data

May 23, 2000 (JP) ......................... 2000-151494

(51) Int. Cl.⁷ ............................ G01R 27/26; B01J 29/393
(52) U.S. Cl. ........................................ 324/662; 347/19
(58) Field of Search ................................. 324/662, 671, 324/687, 663, 519; 382/124; 347/71, 19; 257/532

(56) References Cited

U.S. PATENT DOCUMENTS

| 6,114,862 A | * | 9/2000 | Tartagni et al. | ............. 324/661 |
| 6,317,508 B1 | * | 11/2001 | Kramer et al. | ............. 235/439 |
| 6,346,739 B1 | * | 2/2002 | Lepert et al. | ................ 257/532 |

* cited by examiner

*Primary Examiner*—N. Le
*Assistant Examiner*—James Kerveros
(74) *Attorney, Agent, or Firm*—Cantor Colburn LLP (57) ABSTRACT

A method and an apparatus for measuring capacitances between electrodes of an ink-jetting head. The apparatus includes a multi-probe having a plurality of probes to contact a plurality of electrode rows as one lump contact, each of the probes contacting one of the electrode rows and a plurality of the probes being divided into a predetermined number of groups. The apparatus further includes a plurality of scanners, each of which corresponds to each of the groups, to sequentially switch contacting-terminals of a plurality of the probes and a plurality of capacitance-measuring devices, each of which corresponds to each of the scanners, to measure capacitances between electrodes in all of the groups in parallel.

7 Claims, 4 Drawing Sheets

METHOD AND APPARATUS FOR MEASURING CAPACITANCE

BACKGROUND OF THE INVENTION

The present invention relates to a method and an apparatus for measuring capacitances, and specifically relates to a method and an apparatus for measuring capacitances between electrodes of an ink-jetting head, etc.

Figure 6:
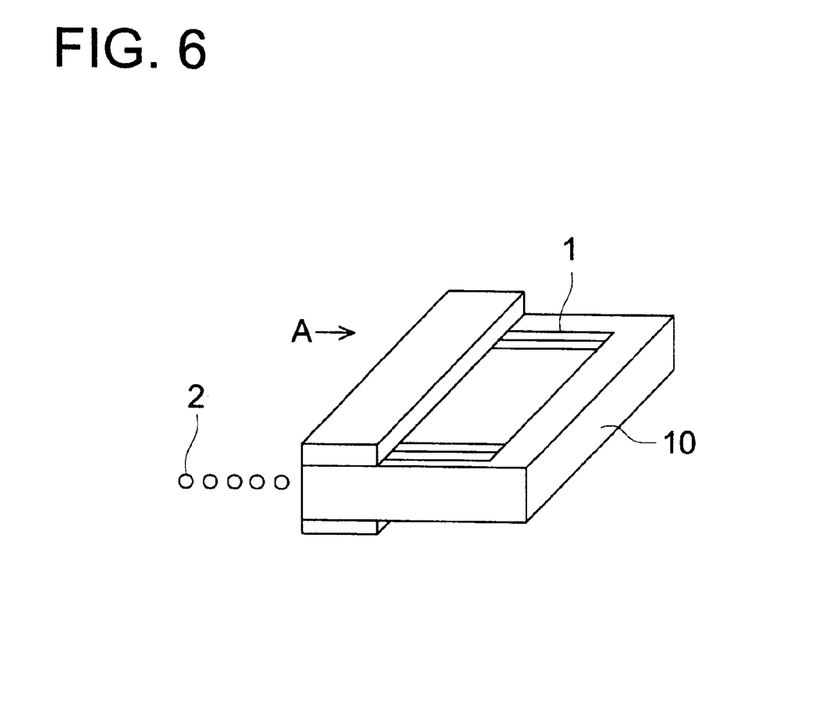
FIG. 6 shows an outer structural view of the ink-jetting head.

To emit ink-particles from ink-jetting head, expanding/shrinking actions of PZTs (Piezoelectronic ceramic) are utilized. Such expanding/shrinking actions are generated by applying an electronic field to each electrode attached to the PZT, which constitutes each of ink-chambers of the ink-jetting head. FIG. 6 shows an outer structural view of ink-jetting head 10. Surface A, indicated by the arrow in FIG. 6, servers as an ink-emitting surface on which nozzles (not shown in the drawings) are arranged. Electrode 1, for applying the electronic field to the PZT, is disposed at a former stage of each of the nozzles, and the ink-particles are emitted from the nozzles by controlling the electronic field applied to electrode 1.

Figure 7A:
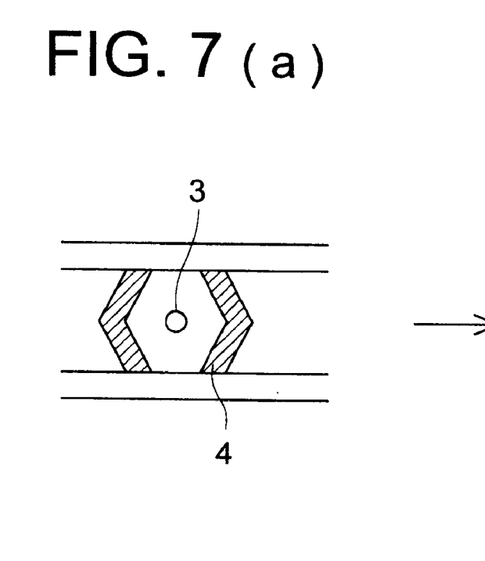
FIG. 7(a) and FIG. 7(b) show an explanatory illustration for explaining a principle of an ink-emitting action.
Figure 7B:
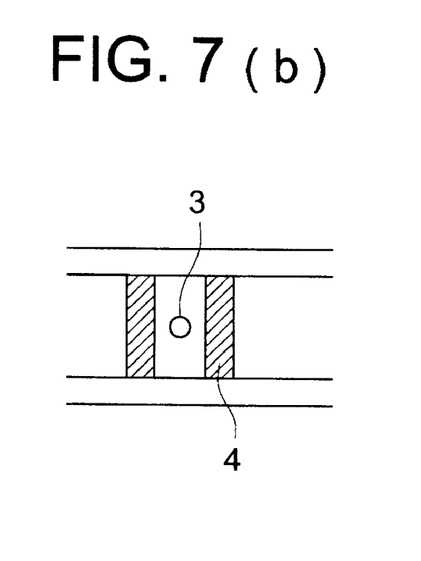

FIG. 7(a) and FIG. 7(b) show an explanatory illustration for explaining the principle of the ink-emitting action. As shown in FIG. 7(a), both sidewalls, which constitute the ink-chamber of the ink-jetting head, can be deformed in concave-wise by applying the electronic field onto electrode 1 attached to PZT 4 of the both sidewalls. Then, when the electronic field returns to zero, the both sidewalls restore its original shape, as shown in FIG. 7(b), resulting in an emitting action of the ink-particle from nozzle 3 due to change of the physical pressure occurring at the same time.

In the abovementioned operation for controlling the emitting actions of the ink-particles, it is necessary that the accuracy of form at the PZT portion, as shown in FIG. 7(a) and FIG. 7(b), is unified in every nozzles, in order to emit uniform ink-particles from each of the nozzles. When the accuracy of form at PZT portion is unified, capacitances between electrodes are equal relative to each other. Accordingly, a measurement of capacitances between electrodes has been conducted to investigate the shape of the PZT portion.

Conventionally, one capacitance-measuring device has been employed for measuring capacitances between electrodes, by sequentially contacting a mono-probe with each of plural electrode rows.

In the abovementioned conventional method, the mono-probe should contact the electrode at the same number of times as the number of the electrodes, and has required a total measuring time defined by,

[total measuring time]=[measuring time for one electrode]×[number of electrodes].

SUMMARY OF THE INVENTION

Accordingly, it is an object of the present invention to shorten the time required for measuring each of capacitances between electrodes included in a plurality of electrode rows. For this purpose, a multi-probe contacts a plurality of electrode rows as one lump contact, and contacting-terminals corresponding to each of the electrode rows are divided into a predetermined number of groups, and capacitance-measuring devices, each of which is equipped for each of the groups, measure the capacitances between electrodes in each of the groups in parallel with the other groups by sequentially switching the contacting-terminals included in each of the groups. Concretely speaking, for instance, when the number of the electrode rows is eight, two capacitance-measuring devices measure the capacitances between electrodes in parallel by using the multi-probe having eight probes, which are divided into two groups, while sequentially switching outputs. Further, for instance, when the number of the electrode rows is sixteen, two capacitance-measuring devices measure the capacitances between electrodes in parallel by using the multi-probe having sixteen probes. Therefore, it is possible to shorten the time required for measuring by increasing a number of probes of the multi-probe, a number of scanners and also a number of capacitance-measuring devices, corresponding to a number of the electrode rows.

Accordingly, the abovementioned object of the present invention can be attained by capacitance-measuring methods and capacitance-measuring apparatus described as follow.

(1) A method for measuring capacitances, comprising the steps of: contacting a multi-probe with a plurality of electrode rows as one lump contact, wherein plural contacting-terminals of the multi-probe are divided into a plurality of groups, each of which includes a predetermined number of contacting-terminals and corresponds to each of the electrode rows; and measuring the capacitances between electrodes in each of the groups in parallel with the other groups by sequentially switching the contacting-terminals included in each of the groups.

(2) The method of item 1, wherein alternate signals, employed for measuring the capacitances in each of the groups, are supplied from a single alternate signal source.

(3) An apparatus for measuring capacitance, comprising: a multi-probe having a plurality of probes to contact a plurality of electrode rows as one lump contact, each of the probes contacting one of the electrode rows and a plurality of the probes being divided into a predetermined number of groups; a plurality of scanners, each of which corresponds to each of the groups, to sequentially switch contacting-terminals of a plurality of the probes; and a plurality of capacitance-measuring devices, each of which corresponds to each of the scanners, to measure capacitances between electrodes in all of the groups in parallel.

(4) The apparatus of item 3, further comprising: an alternate signal source to supply alternate signals having a measuring frequency to each of the capacitance-measuring devices (5) The apparatus of item 3, wherein a measuring frequency of alternate signals to be supplied to each of the capacitance-measuring devices is established so as to minimize cross-interferences between the measuring frequency and a sampling frequency employed for a synchronized detection circuit.

(6) The apparatus of item 3, wherein lengths of wirings, each of which connects the multi-probe with each of the capacitance-measuring devices and corresponds to each of the electrode rows, are uniform.

(7) The apparatus of item 3, further comprising: a lighting device employing a diffusion-reflecting optical system to detect a fitting-mark for positioning, which is formed on a measuring object having a plurality of the electrode rows.

Further, to attain the abovementioned object, other capacitance-measuring methods and capacitance-measuring apparatus, embodied in the present invention, will be described as follow:

(8) A capacitance-measuring method, characterized by comprising the steps of, contacting a multi-probe with a plurality of electrode rows as one lump contact;

switching a measuring-channel by means of a scanner; and measuring the capacitances between electrodes in parallel by means of a plurality of capacitance-measuring devices.

According to the capacitance-measuring method cited in item 8, since the multi-probe contacts a plurality of electrode rows as one lump contact, and a plurality of capacitance-measuring devices measure capacitances between electrodes in parallel while switching the outputs of the multi-probe in a scanning mode, it becomes possible to shorten the time required for switching the electrodes.

(9) A capacitance-measuring apparatus, characterized by comprising:

a multi-probe to contact a plurality of electrode rows as one lump contact;

a scanner to switch outputs of the multi-probe; and a plurality of capacitance-measuring devices to measure the capacitances between electrodes in parallel, outputted from the scanner.

According to the capacitance-measuring apparatus cited in item 9, since the multi-probe contacts a plurality of electrode rows as one lump contact, and a plurality of capacitance-measuring devices measure capacitances between electrodes in parallel while switching the outputs of the multi-probe in a scanning mode, it becomes possible to shorten the time required for switching the electrodes.

(10) The capacitance-measuring method recited in item 8, characterized in that the alternate signals, having the same frequency for measuring the capacitances, are fed to each of the measuring devices from a single alternate signal source.

According to the capacitance-measuring method cited in item 10, since the alternate signals, having the same frequency for measuring the capacitances, are fed to each of the measuring devices from a single alternate signal source, it becomes possible to reduce interferences in the measuring system in which a plurality of measuring devices perform capacitance-measuring operations in parallel.

Incidentally, the term of "interferences", cited in the above, is defined as occurrence of measuring-errors caused by electromagnetic coupled voltages induced in a cable due to electronic currents flowing in other cables. When each of the capacitance-measuring devices individually has its own alternate signal source, interferences in the measuring system could be occur due to slight differences between the alternate signal sources, even if a measuring-instrument manufacturer had strictly performed the accuracy adjustment for every alternate signal source. Accordingly, the abovementioned configuration makes is possible to reduce interferences in the measuring system.

(11) The capacitance-measuring apparatus recited in item 9, characterized in that a single alternate signal source is employed for supplying the alternate signals, for measuring the capacitances, to a plurality of capacitance-measuring devices.

According to the capacitance-measuring apparatus cited in item 11, since the alternate signals, having the same frequency for measuring the capacitances, are fed to each of the measuring devices from a single alternate signal source, it becomes possible to reduce interferences in the measuring system in which a plurality of measuring devices perform capacitance-measuring operations in parallel.

Incidentally, the term of "interferences", cited in the above, is defined as occurrence of measuring-errors caused by electromagnetic coupled voltages induced in a cable due to electronic currents flowing in other cables. When each of the capacitance-measuring devices individually has its own alternate signal source, interferences in the measuring system could be occur due to slight differences between the alternate signal sources, even if a measuring-instrument manufacturer had strictly performed the accuracy adjustment for every alternate signal source. Accordingly, the abovementioned configuration makes is possible to reduce interferences in the measuring system.

(12) The capacitance-measuring apparatus recited in item 9, characterized in that the measuring frequency of each capacitance-measuring device is set at such a frequency that the influence against the sampling frequency at a synchronized detecting circuit is minimized each other.

According to the capacitance-measuring apparatus cited in item 12, it is possible to reduce interferences when measuring capacitances.

In other words, according to the abovementioned configuration, even when each of the capacitance-measuring devices individually has its own alternate signal source, it is possible to eliminate an influence of the disturbance exerted onto output signals of the measuring system and also possible to eliminate an influence of the disturbance, which is n-times of the sampling frequency of the synchronized detecting circuit, by synchronized-detecting the frequency component applied to the measuring system.

(13) The capacitance-measuring apparatus recited in item 9, characterized in that a bridge-wiring is not at all used for wiring between the multi-probe and the capacitance-measuring apparatus.

According to the capacitance-measuring apparatus cited in item 13, since a bridge-wiring is not at all used, it becomes possible to suppress the variation of capacitances between measuring terminals, resulting in accurate measurement of capacitances.

This is because, when the wirings between outputting terminals of the predetermined number of groups are performed in the bridging mode of wiring, the stray capacitances between the wires would vary, since the lengths of the wires corresponding to each of electrode rows are not uniform. According to the abovementioned configuration, it is possible to eliminate such the variation of the stray capacitances, and it is not necessary to obtain compensating data for compensating the variation.

(14) The capacitance-measuring apparatus recited in item 9, characterized in that a diffusion-reflecting optical system is employed as a lighting optical system to detect a fitting-mark for recognizing a work position.

According to the capacitance-measuring apparatus cited in item 14, it is possible to attach contrasts to the fitting-marks for positioning, and thereby, it becomes possible to precisely detect the position of the electrodes.

Incidentally, although a coaxial drop-irradiating illumination has been employed as a lighting optical system for detecting the fitting-marks of the work position (the position of the ink-jetting head) in a general purpose probing device (mainly used for silicon wafers), contrasts have been hardly obtained in respect to the fitting-mark, for recognizing the position, which is formed by depositing aluminum onto the surface area having Ra (roughness) of around 0.5 $\mu$m. The abovementioned configuration makes it possible to solve the problem mentioned above.

BRIEF DESCRIPTION OF THE DRAWINGS

Other objects and advantages of the present invention will become apparent upon reading the following detailed description and upon reference to the drawings in which.

DETAILED DESCRIPTION OF THE PREFERRED EMBODIMENT

Referring to the drawings, the embodiment of the present invention will be detailed in the following.

Figure 1:
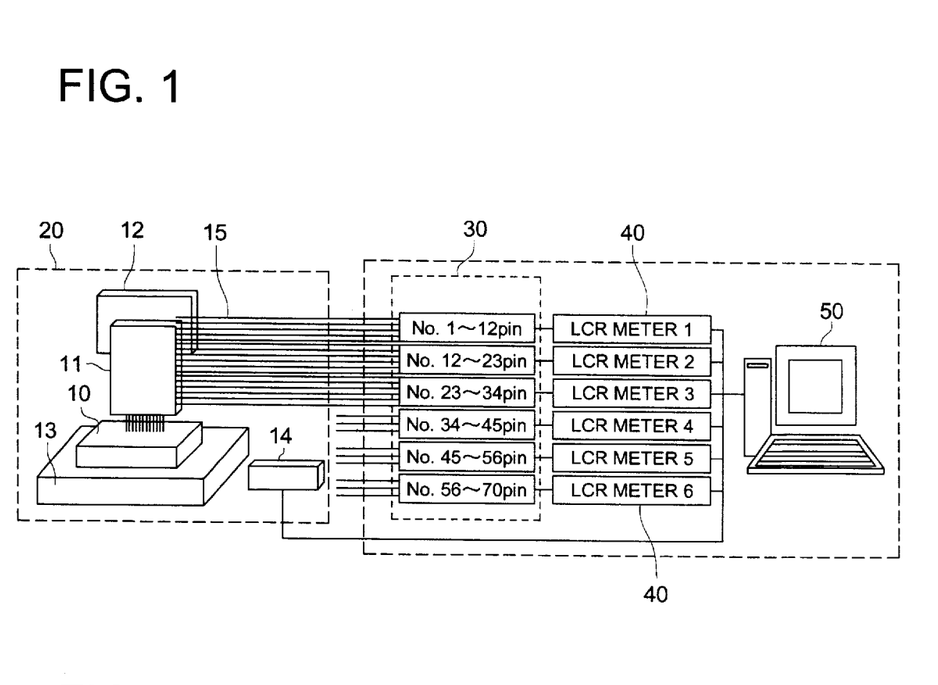
FIG. 1 shows structural block diagram of an embodiment of the present invention.

FIG. 1 shows a structural block diagram of an embodiment of the present invention. In FIG. 1, the same structural elements as those shown in FIG. 6 is denoted by the same reference number. Numeral 11 indicates a probe-card in which probe-needles for contacting electrodes are mounted, and numeral 12 indicates a supporting tool for supporting probe-card 11. In this embodiment, the probe-needles of multi-probe 20 contact a plurality of electrode rows as one lump contact. Numeral 10 indicates an ink-jetting head, in which nozzles for emitting ink-particles are formed, and signals, fed from probe-card 11 for measuring capacitance, can be applied to each gap between electrodes.

Numeral 13 indicates a XYZ-stage, being movable in XYZ directions and on which ink-jetting head 10 is mounted. Numeral 14 indicates a driver for moving XYZ-stage 13 in XYZ directions. Driver 14 moves XYZ-stage 13 to a predetermined position in a predetermined direction, based on position-controlling signals sent from personal computer 50. Numeral 20 indicates a multi-probe, which comprises probe-card 11, supporting tool 12, XYZ-stage 13 and driver 14.

Numeral 30 indicates a switch-controlling unit having a scanning function for scanning switches in a unit of a predetermined number of electrodes, numeral 15 indicates a cable for coupling probe-card 11 with switch-controlling unit 30 in a one to one correspondence, and numeral 40 indicates a LCR-meter for measuring a capacitance between electrodes. In the example shown in the drawing, for instance, a number of pins (a number of electrodes) is 70, which are divided into six groups including a first group of pin-No. 1–12, a second group of pin-No. 12–23, a third group of pin-No. 23–34, a fourth group of pin-No. 34–45, a fifth group of pin-No. 45–56 and a sixth group of pin-No. 56–70. The scanning operation is conducted for each of the six groups divided as the above to measure capacitances by means of LCR-meter 40, number of which corresponds to the number of groups, namely, six LCR-meters are provided. Accordingly, the capacitance measurements are conducted in parallel by each LCR-meter 40 of the six LCR-meters in a unit of the divided group.

Numeral 50 indicates a personal computer for determining whether or not the measured capacitance is normal based on the output signal sent from each LCR-meter 40 while conducting the capacitance measurements and for outputting a stage-driving signal to driver 14. The operations of the apparatus constituted as the above will be detailed in the following.

At first, the probe-needles of probe-card 11 firmly contact the electrodes of ink-jetting head 10. As a result, the electrodes of ink-jetting head 10 are connected to cable 15 in a one to one correspondence. Switch-controlling unit 30 scans switches in every group to select a pair of two specific electrodes and to couples the electrodes to LCR-meter 40, which measures the capacitance between the two specific electrodes and output the measuring results to personal computer 50.

Figure 2:
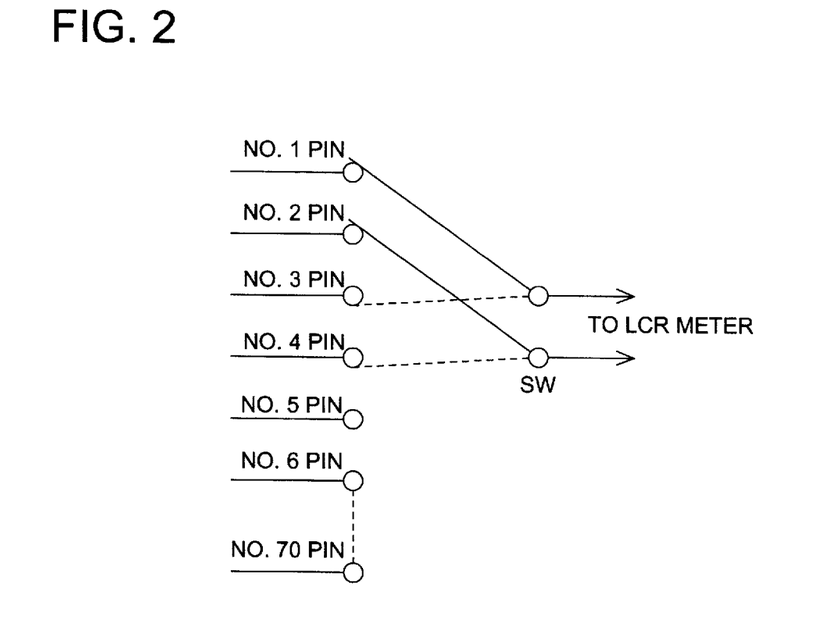
FIG. 2 shows an explanatory illustration of scanning operations.

FIG. 2 shows an explanatory illustration of the scanning operations. As shown in the drawing, for instance, pins 1–70 are provided for connecting the electrodes with them. The contact points of switch SW are sequentially coupled to pins 1–2, pins 3–4, pins 5–6, - - - - and finally pins 69–70, to measure a capacitance between each pair of the electrodes. Next, personal computer 50 sent the driving signal to driver 14 to slightly move XYZ-stage 13, in order to measure a capacitance between each pair of the electrodes being in a shifted phase of position, such as pins 2–3, pins 4–5, so on.

When the capacitance measurements for total of 70 pins are completed in the abovementioned process, personal computer 50 drives driver 14 to move XYZ-stage 13 and conducts the capacitance measurements for next pins 71–140 in the same manner as that in the abovementioned process, namely, personal computer 50 repeats the same operation for the number of electrodes.

According to the abovementioned embodiment, since the outputs of the multi-probe are switched in the scanning operation and a plurality of capacitance-measuring devices are employed for measuring capacitances between electrodes in parallel, it becomes possible to shorten the time required for switching the electrodes.

Further, according to the abovementioned embodiment, since a bridge-wiring is not used, it becomes possible to suppress the variation of capacitances between measuring terminals, resulting in accurate measurement of capacitances.

Figure 3:
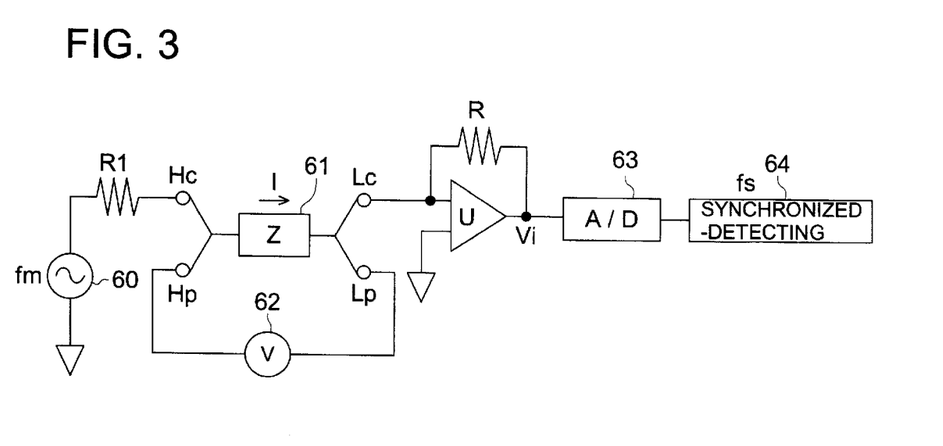
FIG. 3 shows an explanatory illustration for explaining a principle of capacitance measurement performed by the LCR-meter.

FIG. 3 shows an explanatory illustration for explaining the principle of capacitance measurement performed by the LCR-meter. Impedance 61, representing the capacitance between the electrodes, is coupled between four terminals Hc, Hp, Lc, Lp, which are equivalent to capacitance-measuring terminals. The value of impedance 61 is defined as Z. Then, impedance value Z can be expressed as an added value of real number Ro and imaginary number jX, namely, $Z=Ro+jX$. Voltage measuring device 62 is coupled between terminal Hp and terminal Lp, and alternate signal source 60 feeds an alternate signal having frequency Fm to terminal Hc through first resister R1.

Accordingly, an alternate current flows into impedance 61, and further, flows into second resister R, serving as a feedback register of operational amplifier U. Then, output voltage Vi of operational amplifier U is converted to digital data by means of A/D converter 63, and the digital data are detected by synchronized detecting circuit 64 with sampling frequency Fs. The operations of the circuit structured as mentioned above will be detailed in the following.

Since electronic current I, flowing into impedance 61, generates output voltage Vi by flowing into second resister R, serving as a feedback register of operational amplifier U, the equation of $I=Vi/R$ can be established. On the other hand, when the voltage, measured by voltage measuring device 62, is defined as V, impedance value Z can be expressed as $Z=V/I$, and accordingly, $$Z=V/I=V/(Vi/R)=R\cdot V/Vi.$$

According to the above equation, it is possible to measure impedance value Z, and capacitance value can be derived from impedance value Z. In the embodiment of the present invention, capacitances between electrodes are measured in the abovementioned process.

Figure 4:
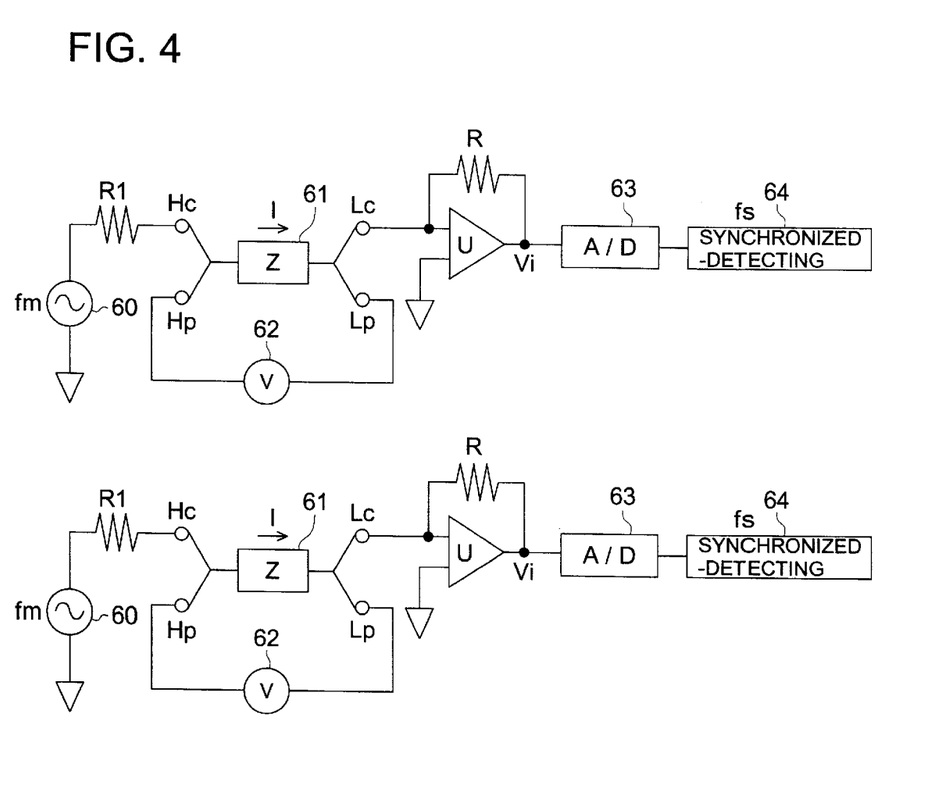
FIG. 4 shows a circuit-diagram for simultaneously measuring capacitances in parallel.

FIG. 4 shows a circuit-diagram for simultaneously measuring capacitances in parallel. The same elements as those in FIG. 3 are denoted by the same reference number or symbols. The circuit shown in FIG. 4 includes a plurality of the circuits shown in FIG. 3. In this circuit, it is desirable that the measuring frequency Fm of each capacitance-measuring device is set at such a frequency that the influence against the sampling frequency at synchronized detecting circuit 64 is minimized each other. As a result, it is possible to reduce interferences when measuring capacitances.

Further, in this case, it becomes possible to decrease interferences in the measuring system in which a plurality of measuring devices perform capacitance-measuring operations in parallel, by feeding the alternate signal, having the same frequency, to each of the measuring devices from a single alternate signal source.

Figure 5:
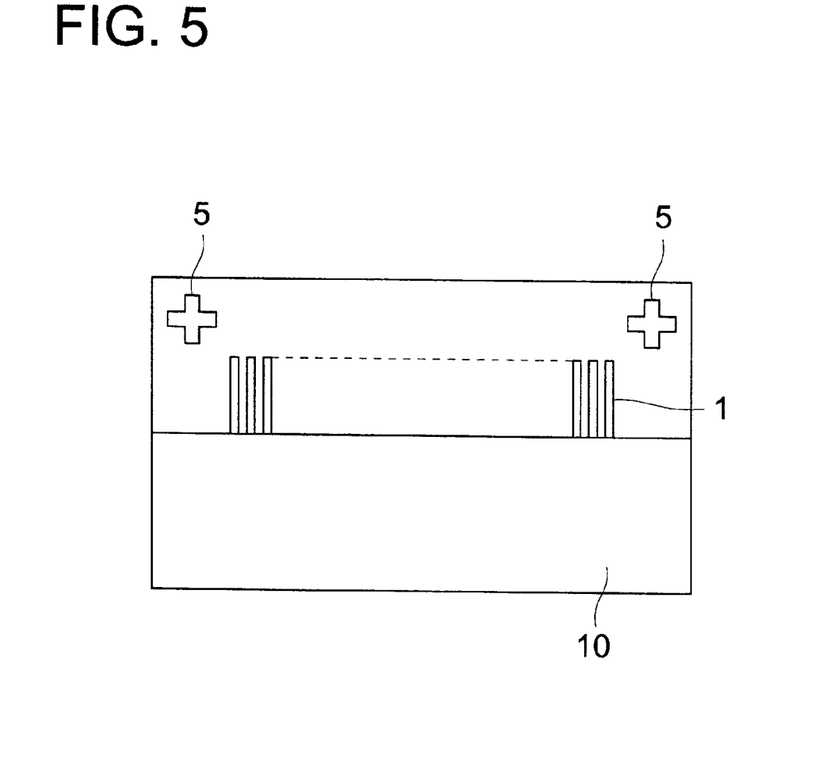
FIG. 5 shows an explanatory illustration of a position-adjusting operation.

When applying the present invention, it is necessary that the probe-needles of probe-card 11 should surely contact pins of the electrodes without sifting. For this purpose, a positioning operation of the ink-jetting head is conducted in the measuring system. FIG. 5 shows an explanatory illustration of a position-adjusting operation. As shown in FIG. 5, the electrodes are aligned at constant intervals on ink-jetting head 10, and fitting-marks 5 for positioning (marks for recognizing a work position) are formed at the outer area of the electrodes.

A diffusion-reflecting optical system irradiates light onto ink-jetting head 10 structured in the above from the upper side. When employing the diffusion-reflecting optical system, it is possible to attach contrasts to the fitting-marks for positioning, and thereby, it becomes possible to precisely detect the position of the electrodes, resulting in improvement of the repeatability of detecting the fitting- marks. Then, a camera (not shown in the drawings) captures the reflected light to detect positions of the fitting-marks. Since the positional relationship between the fitting-marks and the electrodes is known in advance, it is possible to precisely position the electrodes by conducting the position-adjusting operation while recognizing the fitting-marks.

Although a case of measuring capacitances between electrodes of the ink-jetting head is exemplified in the abovementioned embodiment, the scope of the present invention is not limited to the abovementioned embodiment. The present invention is also applicable for measuring capacitances between electrodes of another kind of apparatus in the same way as performed in the abovementioned embodiment.

According to the present invention, the following effects can be attained.

Since the multi-probe contacts a plurality of electrode rows as one lump contact, and a plurality of capacitance-measuring devices measure capacitances between electrodes in parallel while switching the outputs of the multi-probe in a scanning mode, it becomes possible to shorten the time required for switching the electrodes.

Further, since the alternate signals, having the same frequency, are fed to each of the measuring devices from a single alternate signal source, it becomes possible to reduce interferences in the measuring system in which a plurality of measuring devices perform capacitance-measuring operations in parallel.

Still further, it is possible to decrease interferences when measuring capacitances.

Still further, since a bridge-wiring is not at all used, it becomes possible to suppress the variation of capacitances between measuring terminals, resulting in accurate measurement of capacitances.

Still further, it is possible to attach contrasts to the fitting-marks for positioning, and thereby, it becomes possible to precisely detect the position of the electrodes.

As mentioned above, according to the present invention, it becomes possible to provide a capacitance-measuring method and a capacitance-measuring apparatus, which make it possible to shorten the time required for measuring capacitances of electrode rows, to strictly conduct an accuracy-adjusting operation for a plurality of alternate signal sources in order to decrease interferences in the measuring system in which a plurality of measuring devices perform capacitance-measuring operations in parallel, suppress the variation between measuring cables, and to improve the repeatability of detecting the fitting-marks for recognizing the work position.

Disclosed embodiment can be varied by a skilled person without departing from the spirit and scope of the invention.

What is claimed is:

1. A method for measuring capacitances between electrodes of an ink-jetting head, comprising the steps of:

contacting a multi-probe with a plurality of electrode rows of said ink-jetting head as one lump contact, wherein plural contacting-terminals of said multi-probe are divided into a plurality of groups, each of which includes a predetermined number of contacting-terminals and corresponds to each of said electrode rows of said ink-jetting head; and measuring said capacitances between said electrodes in each of said groups in parallel with the other groups by sequentially switching said contacting-terminals included in each of said groups.

2. The method of claim 1, wherein alternate signals, employed for measuring said capacitances in each of said groups, are supplied from a single alternate signal source.

3. An apparatus for measuring capacitances between electrodes of an ink-jetting head, comprising:

a multi-probe having a plurality of probes to contact a plurality of electrode rows of said ink-jetting head as one lump contact, each of said probes contacting one of said electrode rows and a plurality of said probes being divided into a predetermined number of groups;

a plurality of scanners, each of which corresponds to each of said groups, to sequentially switch contacting-terminals of a plurality of said probes; and a plurality of capacitance-measuring devices, each of which corresponds to each of said scanners, to measure capacitances between said electrodes in all of said groups in parallel.

4. The apparatus of claim 3, further comprising:

an alternate signal source to supply alternate signals having a measuring frequency to each of said capacitance-measuring devices.

5. The apparatus of claim 3, wherein a measuring frequency of alternate signals to be supplied to each of said capacitance-measuring devices is established so as to minimize cross-interferences between said measuring frequency and a sampling frequency employed for a synchronized detection circuit.

6. The apparatus of claim 3, wherein lengths of wirings, each of which connects said multi-probe with each of said capacitance-measuring devices and corresponds to each of said electrode rows of said ink-jetting head, are uniform.

7. The apparatus of claim 3, further comprising:

a lighting device employing a diffusion-reflecting optical system to detect a fitting-mark for positioning, which is formed on said ink-jetting head having a plurality of said electrode rows.

* * * * *

UNITED STATES PATENT AND TRADEMARK OFFICE
CERTIFICATE OF CORRECTION

PATENT NO. : 6,531,882 B2
DATED : March 11, 2003
INVENTOR(S) : Morikawa et al.

It is certified that error appears in the above-identified patent and that said Letters Patent is hereby corrected as shown below:

Column 1,
Line 18, delete "servers" and insert therefor -- serves --
Line 37, delete "nozzles" and insert therefor -- nozzle --

Column 2,
Line 17, delete "fol";
Line 18, delete "low" and insert therefor -- follows --

Column 3,
Line 42, delete "of";
Line 43, delete "occurrence" and insert therefor -- occurrences --
Line 48, delete "be";
Line 52, delete "is" and insert therefor -- it --

Column 4,
Line 15, after "minimized" insert therefor -- by --
Line 43, delete "the";
Line 47, before "characterized" and insert therefor -- is --

Column 5,
Line 22, delete "is" and insert therefor -- are --

Column 6,
Line 4, delete "couples" and insert therefor -- couple --
Line 17, after "5," and insert therefor -- and --

UNITED STATES PATENT AND TRADEMARK OFFICE
CERTIFICATE OF CORRECTION

PATENT NO. : 6,531,882 B2
DATED : March 11, 2003
INVENTOR(S) : Morikawa et al.

It is certified that error appears in the above-identified patent and that said Letters Patent is hereby corrected as shown below:

Column 7,
Line 9, after "minimized" and insert therefor -- by --
Line 19, delete "sifting" and insert therefor -- shifting --

Signed and Sealed this

Eighteenth Day of May, 2004

JON W. DUDAS
*Acting Director of the United States Patent and Trademark Office*